(12) United States Patent
Saito (10) Patent No.: US 11,443,951 B2
(45) Date of Patent: Sep. 13, 2022

(54) RESIN PROTECTION MEMBER FORMING APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 149 days.

(21) Appl. No.: 17/089,049

(22) Filed: Nov. 4, 2020

(65) Prior Publication Data

US 2021/0134598 A1 May 6, 2021

(30) Foreign Application Priority Data

Nov. 6, 2019 (JP) .............................. JP2019-201387

(51) Int. Cl.
| | |
|---|---|
| *B05C 11/02* | (2006.01) |
| *B05C 11/10* | (2006.01) |
| *H01L 21/67* | (2006.01) |
| *H01L 21/304* | (2006.01) |
| *H01L 21/02* | (2006.01) |
| *H01L 23/38* | (2006.01) |
| *B29C 45/03* | (2006.01) |
| *B29C 43/52* | (2006.01) |
| *B29K 101/12* | (2006.01) |
| *B29L 31/34* | (2006.01) |

(52) U.S. Cl.
CPC .......... *H01L 21/304* (2013.01); *B05C 11/023* (2013.01); *B05C 11/10* (2013.01); *B29C 43/52* (2013.01); *B29C 45/03* (2013.01); *H01L 21/02282* (2013.01); *H01L 21/02307* (2013.01); *H01L 23/38* (2013.01); *B29K 2101/12* (2013.01); *B29L 2031/34* (2013.01)

(58) Field of Classification Search
CPC combination set(s) only.
See application file for complete search history.

(56) References Cited

U.S. PATENT DOCUMENTS

| | | | |
|---|---|---|---|
| 2017/0217062 A1* | 8/2017 | Bae .......................... H01L 24/00 |
| 2019/0358903 A1* | 11/2019 | Watanabe ............... B29C 45/464 |
| 2020/0023562 A1* | 1/2020 | Anegawa ................. B29C 45/78 |
| 2020/0303230 A1* | 9/2020 | Sonoda ............... H01L 21/6831 |

FOREIGN PATENT DOCUMENTS

JP          2017168565 A        9/2017

* cited by examiner

*Primary Examiner* — Mohsen Ahmadi
(74) *Attorney, Agent, or Firm* — Greer Burns & Crain, Ltd.

(57) ABSTRACT

A resin protection member forming apparatus includes a stage having a resin placement surface on which a particulate thermoplastic resin is to be placed. The stage includes a Peltier device, a DC power source, and a switch. The Peltier device is disposed inside the stage and has an upper surface, which is parallel and close to the resin placement surface, and a lower surface, which is far from the resin placement surface. The DC power source supplies a DC current to the Peltier device. The switch changes a direction of the DC current to be supplied to the Peltier device, between a first direction to heat the upper surface of the Peltier device and a second direction, opposite to the first direction, to cool the upper surface of the Peltier device.

1 Claim, 6 Drawing Sheets

RESIN PROTECTION MEMBER FORMING APPARATUS

BACKGROUND OF THE INVENTION

Field of the Invention

The present invention relates to a resin protection member forming apparatus.

Description of the Related Art

According to the technique disclosed in Japanese Patent Laid-open No. 2017-168565, a protection member is formed with a resin on one side of an as-sliced wafer. The wafer is held by a chuck table via the protection member, and the other side of the wafer is ground. As a result, waviness of the wafer is removed, and at the same time, the wafer is made uniform in thickness.

The formation of the protection member is carried out, for example, in the manner described hereinafter. First, a sheet is disposed on a stage. A liquid resin is supplied onto the sheet. The liquid resin is pressed and spread by the one side of the wafer. As a result, the liquid resin is pressed and spread over the entire surface of the one side of the wafer. Subsequently, the liquid resin is hardened or cured.

This liquid resin is sucked up by a pump from a tank in which the liquid resin is filled, and is supplied onto the sheet on the stage. As the tank of the liquid resin is heavy, its replacement work places a burden on a worker. As a countermeasure for this burden, there is a technique that uses a particulate solid resin.

According to this technique, the particulate resin is melted into a liquid state on a stage, and the resulting molten resin is pressed and spread into a disc-shaped layer by one side of a wafer. The spread molten resin solidifies through cooling. As a result, a disc-shaped protection member can be formed on the one side of the wafer.

SUMMARY OF THE INVENTION

According to the above-described technique that uses the particulate resin, the molten resin pressed and spread in the disc shape by the one side of the wafer solidifies through cooling. The cooling is natural cooling. Described specifically, the molten resin is allowed to stand in the atmosphere, and is thus cooled at the environment temperature. In natural cooling, however, the molten resin pressed and spread in the disc shape is cooled fast at an outer peripheral portion, but is cooled slowly at a central portion. A difference thus occurs in thickness between the outer peripheral portion and the central portion of the disc-shaped protection member.

The present invention thus has as an object thereof the provision of a protection member forming apparatus which can form a protection member with a substantially uniform thickness when forming it by melting a solid resin, pressing and spreading the molten resin over the entire surface of one side of a wafer, and then allowing the molten resin to solidify.

In accordance with an aspect of the present invention, there is provided a resin protection member forming apparatus including a stage having a resin placement surface on which a particulate thermoplastic resin is placed, a wafer holding unit that has a wafer holding surface facing the resin placement surface and holds a wafer by the wafer holding surface, an up/down moving mechanism configured to relatively move the stage and the wafer holding unit in an up/down direction vertical to the resin placement surface, and a control unit. The stage includes a Peltier device disposed inside the stage and having an upper surface, which is parallel and close to the resin placement surface, and a lower surface, which is far from the resin placement surface, a direct current (DC) power source that supplies a DC current to the Peltier device, and a switch that changes a direction of the DC current, which is to be supplied to the Peltier device, between a first direction to heat the upper surface of the Peltier device and a second direction, opposite to the first direction, to cool the upper surface of the Peltier device. The control unit controls the switch to cause the DC current to flow in the first direction so that the upper surface of the Peltier device is heated to melt the thermoplastic resin placed on the resin placement surface and that the resulting molten resin is pressed and spread over an entire surface of one side of the wafer between the resin placement surface and the one side of the wafer, and then controls the switch to cause the DC current to flow in the second direction so that the upper surface of the Peltier device is cooled to solidify the resin pressed and spread between the resin placement surface and the one side of the wafer and that a protection member is formed on the entire surface of the one side of the wafer.

According to the resin protection member forming apparatus, the particulate thermoplastic resin held between the resin placement surface and the one side of the wafer is melted through heating of the resin placement surface by the Peltier device, and is then pressed and spread over the entire surface of the one side of the wafer. The resin placement surface is then cooled by the Peltier device, whereby the pressed and spread resin solidifies through cooling to form the protection member over the entire surface of the one side of the wafer.

As described above, in this resin protection member forming apparatus, the molten resin is cooled by the resin placement surface that is planer, so that the molten resin can be cooled evenly. It is hence possible to suppress the occurrence of variations in the thickness of the protection member to be obtained by allowing the molten resin to solidify. As a result, the protection member can be provided with a substantially uniform thickness.

Further, in the resin protection member forming apparatus, the resin placement surface and the thermoplastic resin placed on the resin placement surface are heated by heating the upper surface of the Peltier device. During this time, the lower surface of the Peltier device is cooled, thus increasing cooling effects, under which the resin placement surface is to be cooled, in the next step. It is thus possible to shorten the time required to form the protection member on the one side of the wafer.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
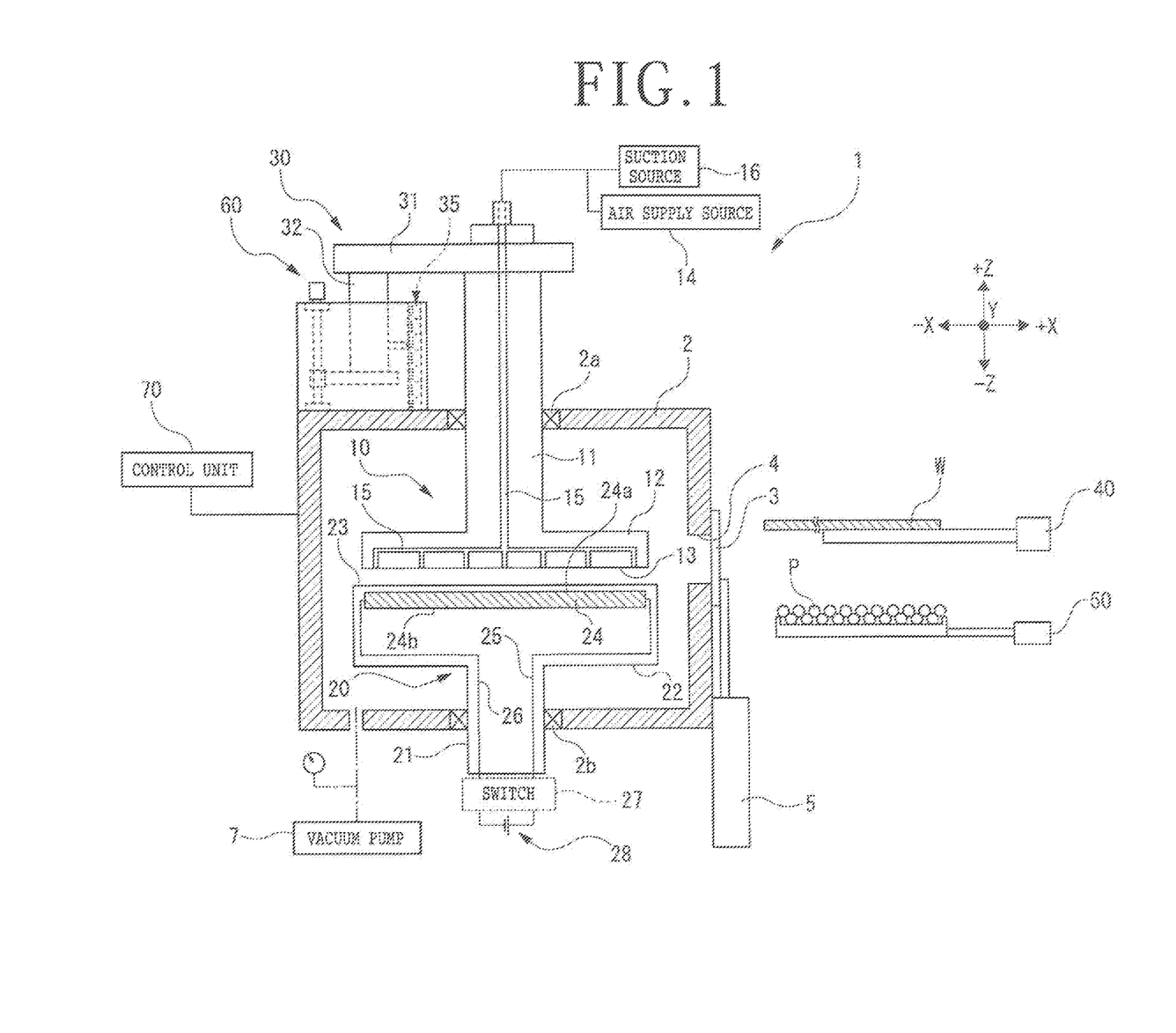
FIG. 1 is a cross-sectional view depicting the configuration of a resin protection member forming apparatus according to an embodiment of the present invention.

A resin protection member forming apparatus 1 according to an embodiment of the present invention as depicted in FIG. 1 is used to form a protection member on the entire surface of one side of a wafer W by melting a solid particulate thermoplastic resin P placed on a resin placement surface 23 of a stage 20. The material of the thermoplastic resin P is, for example, a polyolefin. To facilitate separation of the placed thermoplastic resin P, the resin placement surface 23 has, for example, a fluororesin coating applied thereto.

The resin protection member forming apparatus 1 includes, in a vacuum forming chamber 2, a wafer holding unit 10, a stage 20, and an up/down moving mechanism (up/down operating mechanism) 30. The wafer holding unit 10 has a wafer holding surface 13 and holds the wafer W by the wafer holding surface 13. The stage 20 has the resin placement surface 23 on which the particulate thermoplastic resin P is to be placed.

The vacuum forming chamber 2 is a casing for the resin protection member forming apparatus 1, the inside of which can be brought into a vacuum state, and includes an opening 4, a cover 3 that can cover the opening 4, a cover open/close mechanism 5 that opens/closes the cover 3, and a vacuum pump 7 that brings the inside of the vacuum forming chamber 2 to a vacuum.

The wafer holding unit 10 includes a support post 11 extending through a top wall of the vacuum forming chamber 2; and a wafer holding table 12 arranged on a lower end of the support post 11 and disposed in the vacuum forming chamber 2. The wafer holding table 12 has a lower surface which serves as the wafer holding surface 13 configured to hold the wafer W under suction. In a portion of the top wall of the vacuum forming chamber 2 through which the support post 11 extends, a vacuum seal 2a is arranged to maintain the vacuum in the vacuum forming chamber 2.

Through the support post 11 and the wafer holding table 12, an air passage 15 is arranged. The air passage 15 is connected to an air supply source 14 and a suction source 16. The wafer holding surface 13 on the wafer holding table 12 is configured so that the wafer holding surface 13 can selectively be brought into communication with the air supply source 14 or the suction source 16 via the air passage 15. The wafer holding unit 10 can hold the wafer W under suction by the wafer holding surface 13 communicating to the suction source 16.

The stage 20 includes a support post 21 extending through a bottom wall of the vacuum forming chamber 2; and a resin placement table 22 arranged on an upper end of the support post 21 and disposed in the vacuum forming chamber 2. The resin placement table 22 has an upper surface which serves as the resin placement surface 23 configured to have the thermoplastic resin P placed thereon.

The resin placement surface 23 is disposed facing the wafer holding surface 13 of the wafer holding unit 10. Further, in a portion of the bottom wall of the vacuum forming chamber 2 through which the support post 21 extends, a vacuum seal 2b is arranged to maintain the vacuum in the vacuum forming chamber 2.

The resin protection member forming apparatus 1 also includes a wafer transfer mechanism 40 and a resin transfer mechanism 50. The wafer transfer mechanism 40 and the resin transfer mechanism 50 are transfer members such as robot hands. The wafer transfer mechanism 40 and resin transfer mechanism 50 may be either discrete members or a common single member.

The wafer transfer mechanism 40 transfers the wafer W from an outside to the vacuum forming chamber 2. The wafer transfer mechanism 40 can transfer the wafer W through the opening 4 and dispose it in the vacuum forming chamber 2 at a position opposite the wafer holding surface 13 of the wafer holding unit 10. At the wafer holding unit 10, the wafer W disposed as described above can be held under suction by the wafer holding surface 13 communicating to the suction source 16.

The resin transfer mechanism 50 transfers the particulate thermoplastic resin P to the resin protection member forming apparatus 1 from the outside. The resin transfer mechanism 50 transfers the particulate thermoplastic resin P through the opening 4 and places it on the resin placement surface 23 of the stage 20 in the vacuum forming chamber 2. To prevent the particulate thermoplastic resin P from falling down from the resin placement surface 23, an annular raised portion may also be formed on an outer periphery of the resin placement surface 23.

The up/down moving mechanism 30 is disposed on the top wall of the vacuum forming chamber 2 and is connected to the support post 11 of the wafer holding unit 10. The up/down moving mechanism 30 relatively moves the wafer holding unit 10 and the stage 20 in a Z-axis direction that is an up/down direction vertical to the resin placement surface 23. In this embodiment, the up/down moving mechanism 30 moves the support post 11 of the wafer holding unit 10 in the Z-axis direction. Described specifically, the up/down moving mechanism 30 is configured so that the wafer holding unit 10 is moved along the Z-axis direction relative to the stage 20 which is fixed.

Described in detail, the up/down moving mechanism 30 includes an arm 31 connected to the support post 11 and extending in a horizontal direction, a drive rod 32 connected to the arm 31 and extending along the Z-axis direction, and a sensor 35 that detects a moving distance. The drive rod 32 is moved up or down by an undepicted drive source, whereby the arm 31 and the wafer holding unit 10 (support post 11) connected to the arm 31 are moved up or down along the Z-axis direction. The moving distance of the wafer holding unit 10 is detected by the sensor 35.

The resin protection member forming apparatus 1 also includes a load detector 60. The load detector 60 is connected to the support post 11 of the wafer holding unit 10 via the up/down moving mechanism 30. When the wafer holding unit 10 and the stage 20 come to contact with each other via the wafer W and the thermoplastic resin P, the load detector 60 detects a load applied to the wafer holding unit 10 (in other words, a force under which the wafer W presses the thermoplastic resin P).

The stage 20 in this embodiment internally has a Peltier device 24. The Peltier device 24 has, for example, a planar disc shape, and is disposed near and in parallel to the resin placement surface 23 in the resin placement table 22 of the stage 20. The Peltier device 24 has an upper surface 24a, which is parallel and close to the resin placement surface 23, and a lower surface 24b, which is far from the resin placement surface 23.

A first power line 25 and a second power line 26 are laid in the support post 21 and the resin placement table 22 and are attached at one ends thereof to opposite ends of the Peltier device 24, respectively. The first power line 25 and the second power line 26 are connected at the other ends thereof to a DC power source 28 via a switch 27.

The DC power source 28 is a power source that supplies a DC current to the Peltier device 24. The switch 27 has a function to connect the DC power source 28 to the Peltier device 24 via the first power line 25 and the second power line 26 and also a function to change the direction of the DC current flowing from the DC power source 28 to the Peltier device 24 via the first power line 25 and the second power line 26.

Described specifically, the switch 27 is configured in such a manner that the direction of the DC current to be supplied to the Peltier device 24 is changed between a first direction to heat the upper surface 24a of the Peltier device 24 and a second direction, opposite to the first direction, to cool the upper surface 24a of the Peltier device 24. On the other hand, the lower surface 24b of the Peltier device 24 is cooled when the DC current flows in the first direction but is heated when the DC current flows in the second direction.

The resin protection member forming apparatus 1 also includes a control unit 70 to control individual members of the resin protection member forming apparatus 1. The resin protection member forming apparatus 1 may include, for example, a computer as the control unit 70. The control unit 70 controls the individual members of the above-described resin protection member forming apparatus 1 to form the protection member on the entire surface of the one side of the wafer W.

Figure 2:
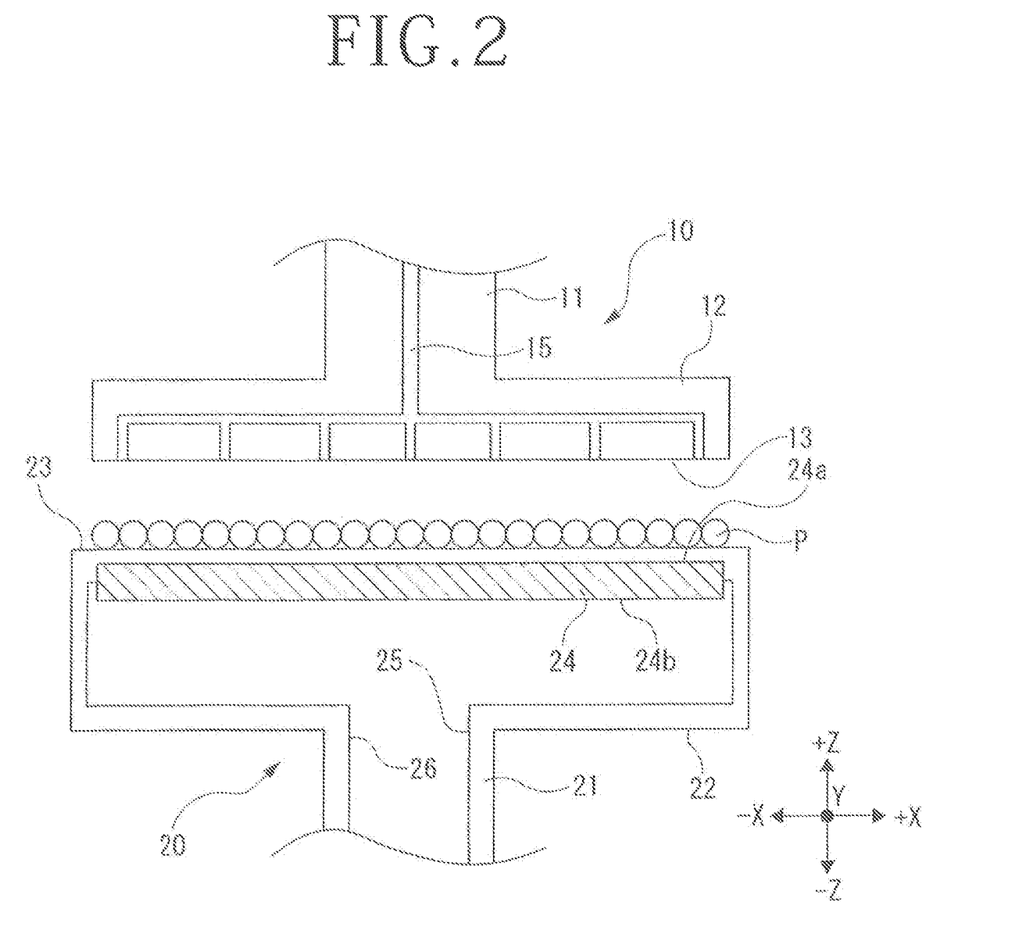
FIG. 2 is a cross-sectional view illustrating a resin feeding step in the resin protection member forming apparatus.

A description will next be made about a forming operation of the protection member for the wafer W in the resin protection member forming apparatus 1. First, the control unit 70 controls the cover open/close mechanism 5 to open the cover 3 of the vacuum forming chamber 2 so that the opening 4 is exposed. The control unit 70 then moves, in a −X direction, the resin transfer mechanism 50 with the particulate thermoplastic resin P held thereon, whereby the thermoplastic resin P is loaded into the vacuum forming chamber 2 from the opening 4 so exposed. The control unit 70 further controls the resin transfer mechanism 50 so that, as illustrated in FIG. 2, the thermoplastic resin P is placed, for example, as being evenly spread on the resin placement surface 23 of the stage 20 (resin supplying step).

Figure 3:
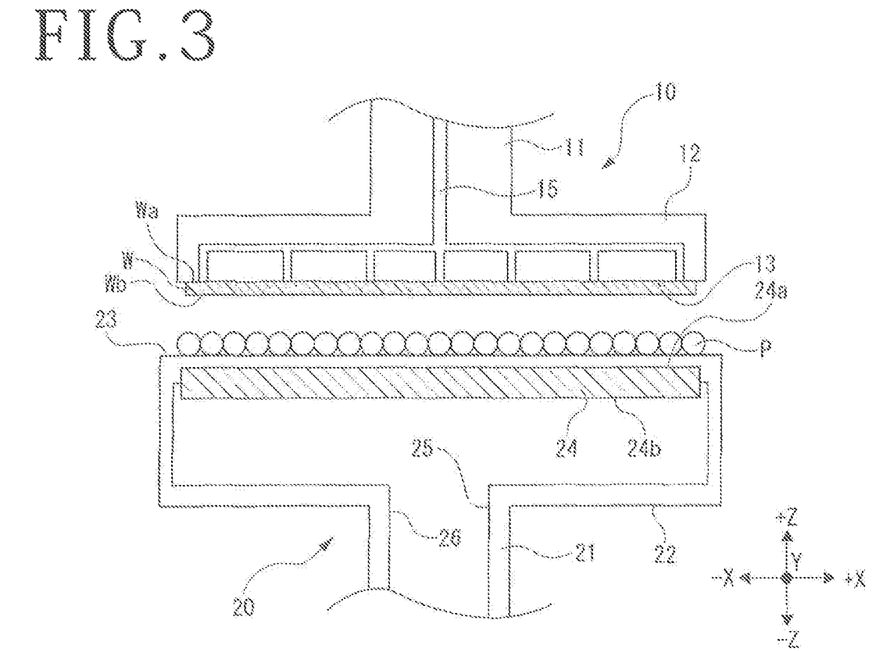
FIG. 3 is a cross-sectional view illustrating a wafer holding step in the resin protection member forming apparatus.

Next, the control unit 70 brings the suction source 16, which is depicted in FIG. 1, into communication with the wafer holding surface 13 of the wafer holding unit 10. As a result, the wafer holding surface 13 is maintained in a negative pressure. Further, the control unit 70 moves, in the −X direction, the wafer transfer mechanism 40 with the wafer W held thereon, whereby the wafer W is loaded into the vacuum forming chamber 2 from the exposed opening 4 and is placed at a position opposite the wafer holding surface 13. As illustrated in FIG. 3, the control unit 70 then holds under suction the wafer W at a first side (the other side) Wa thereof by the wafer holding surface 13. As a result, the wafer W is placed above the thermoplastic resin P placed on the resin placement surface 23, with a second side (the one side) Wb thereof being directed toward the thermoplastic resin P (wafer holding step).

Figure 4:
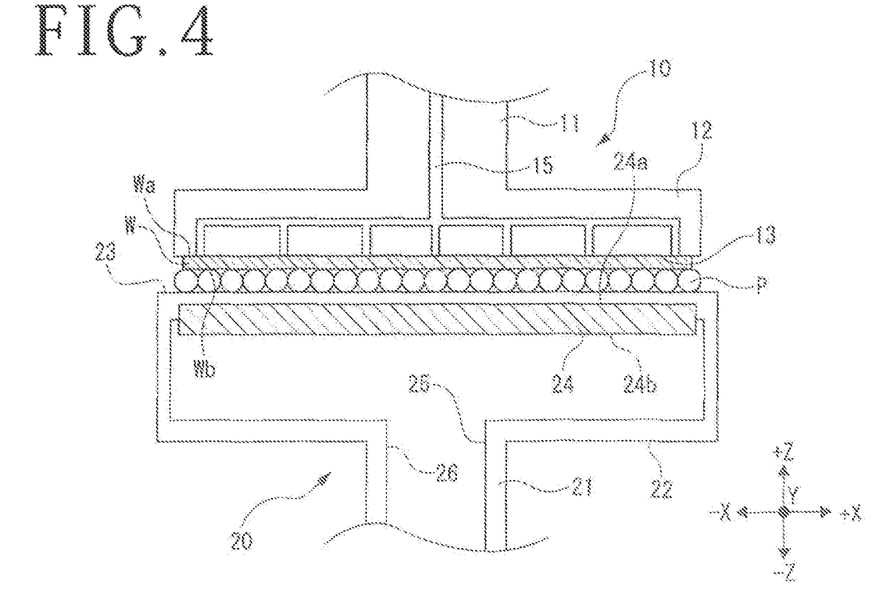
FIG. 4 is a cross-sectional view illustrating a wafer contacting step in the resin protection member forming apparatus.

The control unit 70 next controls the cover open/close mechanism 5 depicted in FIG. 1, so that the cover 3 of the vacuum forming chamber 2 is closed to cover the opening 4. The control unit 70 then controls the up/down moving mechanism 30 to move the wafer holding unit 10 downward along the Z-axis direction. As a result, as depicted in FIG. 4, the second side Wb of the wafer W held on the wafer holding surface 13 of the wafer holding unit 10 is brought into contact with the thermoplastic resin P held on the resin placement surface 23 of the stage 20 (wafer contacting step).

In the manner as described above, the control unit 70 controls the up/down moving mechanism 30 to bring the second side Wb of the wafer W which is held on the wafer holding unit 10 into contact with the particulate thermoplastic resin P held on the resin placement surface 23, and thus, the particulate thermoplastic resin P is pressed by a relatively weak force. In this state, the control unit 70 controls the vacuum pump 7 to evacuate the inside of the vacuum forming chamber 2.

When the atmospheric pressure in the vacuum forming chamber 2 has decreased to a predetermined value or lower in this state, the control unit 70 also controls the switch 27 depicted in FIG. 1 to connect the DC power source 28 to the Peltier device 24 via the first power line 25 and the second power line 26. The control unit 70 then controls the switch 27 to set the direction of the DC current from the DC power source 28 to the first direction to heat the upper surface 24a of the Peltier device 24 as indicated by arrows D1 in FIG. 5.

Figure 5:
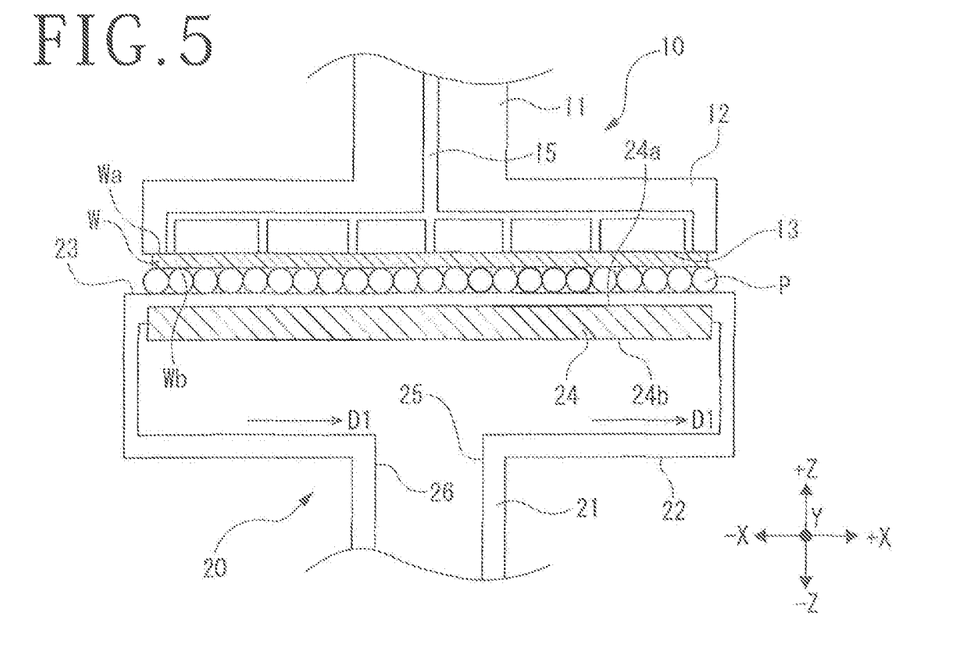
FIG. 5 is a cross-sectional view illustrating a heating step in the resin protection member forming apparatus.

In the manner as described above, the control unit 70 allows the DC current to flow in the first direction while pressing the thermoplastic resin P by the second side Wb of the wafer W, whereby the upper surface 24a of the Peltier device 24 is heated and the resin placement surface 23 and the thermoplastic resin P on the resin placement surface 23 are heated to melt the thermoplastic resin P (heating step). During this heating step, the lower surface 24b of the Peltier device 24 is cooled.

Figure 6:
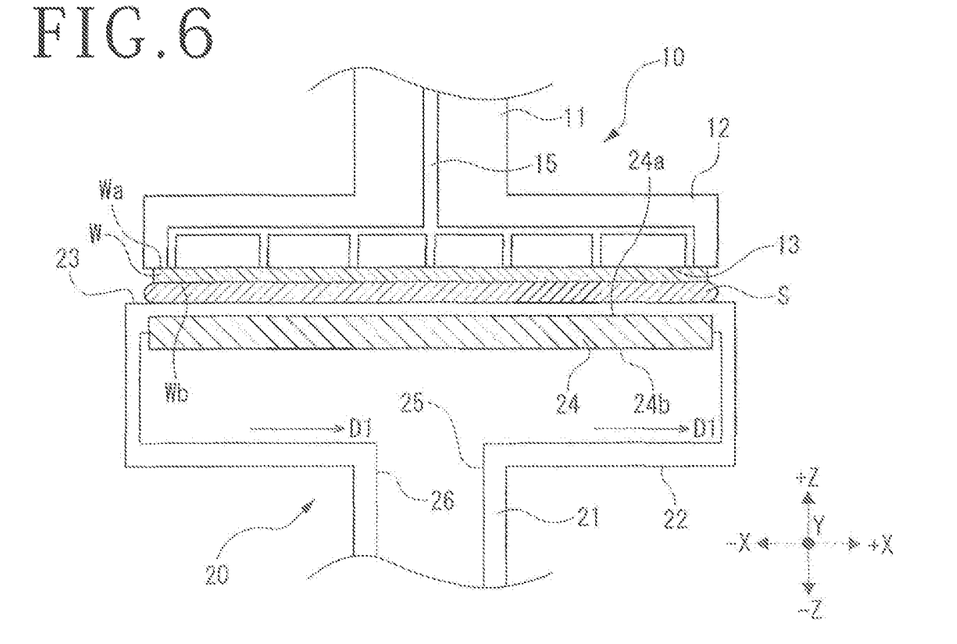
FIG. 6 is a cross-sectional view illustrating a pressing and spreading step in the resin protection member forming apparatus.

After the thermoplastic resin P has melted, the control unit 70 controls the up/down moving mechanism 30 to press the thermoplastic resin P more strongly by the second side Wb of the wafer W, whereby the molten thermoplastic resin P is pressed and spread over the entire surface of the second side Wb between the resin placement surface 23 and the second side Wb of the wafer W. As a result, as illustrated in FIG. 6, a molten resin layer S that is formed from the molten, pressed and spread thermoplastic resin P is formed so as to cover the entire surface of the second side Wb of the wafer W (pressing and spreading step).

Figure 7:
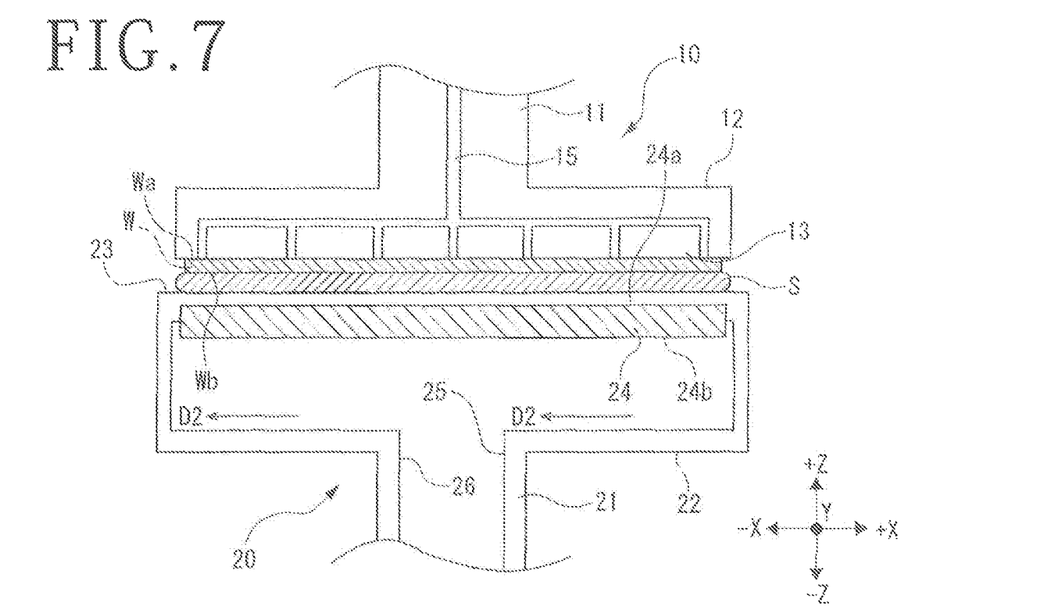
FIG. 7 is a cross-sectional view illustrating a cooling (solidifying) step in the resin protection member forming apparatus.

Subsequently, the control unit 70 controls the switch 27 (see FIG. 1) so that, as indicated by an arrow D2 in FIG. 7, the DC current from the DC power source 28 is allowed to flow in the second direction, opposite to the first direction, to cool the upper surface 24a of the Peltier device 24. As a result, the control unit 70 cools the upper surface 24a of the Peltier device 24 while pressing the molten resin layer S by the second side Wb of the wafer W. By cooling the upper surface 24a as described above, the control unit 70 cools the resin placement surface 23 and the molten resin layer S on the resin placement surface 23 so that the molten resin layer S solidifies. As a result, a protection member Sa (see FIG. 8) that is formed from the resulting solidified resin layer S is formed over the entire surface of the second side Wb of the wafer W (cooling (solidifying) step). During this cooling (solidifying) step, the lower surface 24b of the Peltier device 24 is heated.

Figure 8:
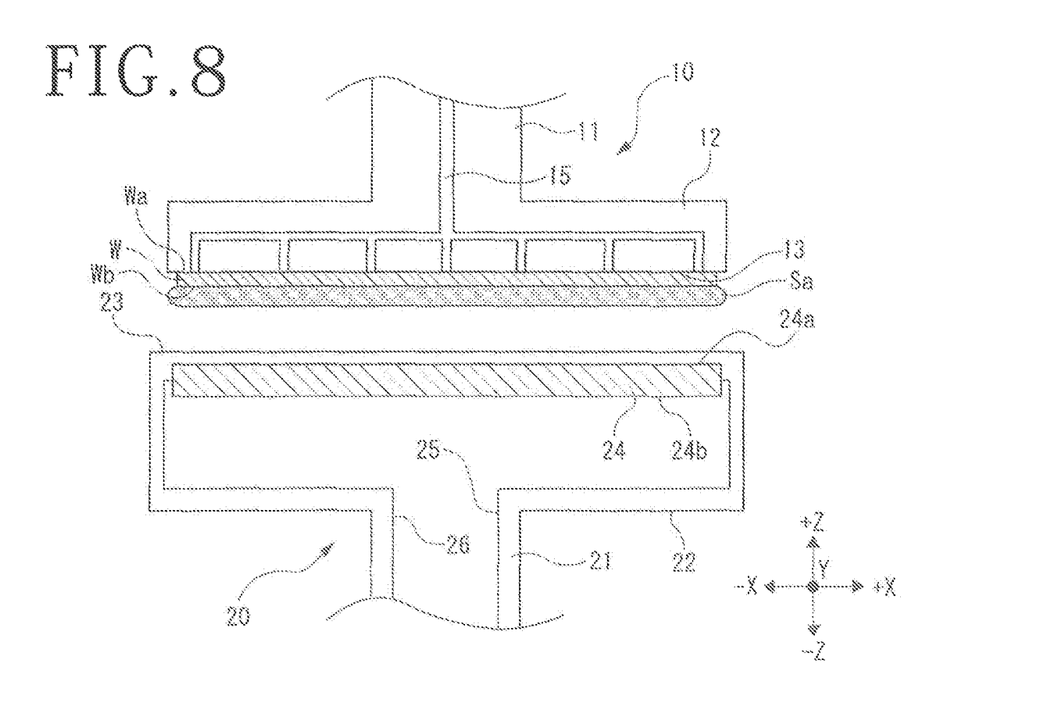
FIG. 8 is a cross-sectional view illustrating a separating step in the resin protection member forming apparatus.

The control unit 70 next controls the switch 27 to cut off the DC power source 28 from the Peltier device 24. The control unit 70 then controls the up/down moving mechanism 30 depicted in FIG. 1 to move the wafer holding unit 10 upward along the Z-axis direction, whereby, as illustrated in FIG. 8, the wafer holding unit 10 is separated from the stage 20 (the resin placement surface 23). In other words, the control unit 70 separates, from the resin placement surface 23, a protection member Sa formed on the second side Wb of the wafer W. As a result, the control unit 70 can hold the wafer W with the protection member Sa formed on the second side Wb, by the wafer holding surface 13 of the wafer holding unit 10 (separating step).

Next, the control unit 70 stops the vacuum pump 7 depicted in FIG. 1 and controls the cover open/close mechanism 5, whereby the cover 3 of the vacuum forming chamber 2 is opened to expose the opening 4. As a result, the vacuum inside the vacuum forming chamber 2 is broken.

Figure 9:
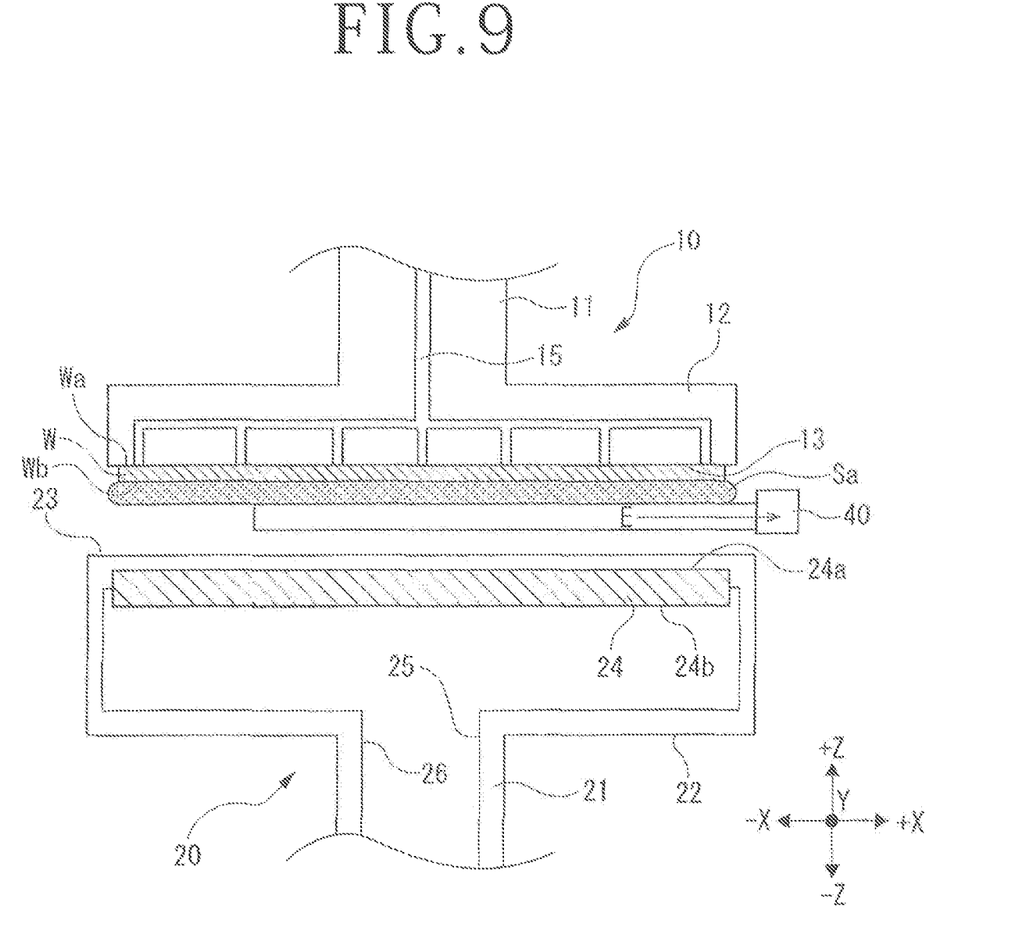
FIG. 9 is a cross-sectional view illustrating a wafer unloading step in the resin protection member forming apparatus.

As illustrated in FIG. 9, the control unit 70 then places the wafer transfer mechanism 40 in opposition to the wafer holding surface 13 of the wafer holding unit 10 to bring the wafer transfer mechanism 40 into contact with the protection member Sa that covers the second side Wb of the wafer W. Further, the control unit 70 brings the wafer holding surface 13 of the wafer holding unit 10 into communication with the air supply source 14. As a result, the suction of the wafer W by the wafer holding surface 13 is stopped, and the wafer W is held by the wafer transfer mechanism 40. As an alternative, the wafer transfer mechanism 40 may be configured to hold the first side Wa of the wafer W.

The control unit 70 then moves the wafer W in a +X direction as indicated by an arrow E, by the wafer transfer mechanism 40, whereby the wafer W is unloaded out of the vacuum forming chamber 2 through the opening 4 (wafer unloading step).

As described above, in the heating step of this embodiment, the resin placement surface 23 is heated by the Peltier device 24 to melt the particulate thermoplastic resin P held between the resin placement surface 23 and the second side Wb of the wafer W, and the resulting molten thermoplastic resin P is then pressed and spread to form the molten resin layer S. In the cooling (solidifying) step, the resin placement surface 23 is then cooled by the Peltier device 24 to cool the molten resin layer S so that it solidifies, whereby the protection member Sa is formed over the entire surface of the second side Wb of the wafer W.

In this embodiment, the molten resin layer S is cooled by the resin placement surface 23 that is planar, so that the molten resin layer S can be cooled evenly. It is hence possible to suppress the occurrence of variations in the thickness of the protection member Sa to be obtained by allowing the molten resin layer S to solidify. As a result, the thickness of the protection member Sa can be made substantially uniform.

In the heating step of this embodiment, the upper surface 24a of the Peltier device 24 is heated so that the resin placement surface 23 and the thermoplastic resin P placed on the resin placement surface 23 are heated to obtain the molten resin layer S. As the lower surface 24b of the Peltier device 24 is cooled during this heating step, the cooling effects under which the resin placement surface 23 is to be cooled in the next step, i.e., the cooling (solidifying) step, can be increased. It is thus possible to shorten the time required to cool the molten resin layer S so that it solidifies for the formation of the protection member Sa on the second side Wb of the wafer W (the time of the cooling (solidifying) step).

In this embodiment, when the wafer holding unit 10 and the stage 20 come to contact each other via the wafer W and the molten resin layer S, a load applied to the wafer holding unit 10 is detected by the load detector 60 arranged on the top wall of the vacuum forming chamber 2. Such a load detector may also be arranged in the wafer holding table 12 of the wafer holding unit 10 or in the resin placement table 22 of the stage 20.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A resin protection member forming apparatus, comprising:
    a stage having a resin placement surface on which a particulate thermoplastic resin is to be placed;
    a wafer holding unit that has a wafer holding surface facing the resin placement surface and holds a wafer by the wafer holding surface;
    an up/down moving mechanism configured to relatively move the stage and the wafer holding unit in an up/down direction vertical to the resin placement surface; and
    a control unit,
    wherein the stage includes
        a Peltier device disposed inside the stage and having an upper surface and a lower surface, the upper surface being parallel and close to the resin placement surface, the lower surface being far from the resin placement surface,
        a direct current power source that supplies a direct current to the Peltier device, and
        a switch that changes a direction of the direct current to be supplied to the Peltier device, between a first direction to heat the upper surface of the Peltier device and a second direction, opposite to the first direction, to cool the upper surface of the Peltier device, and
    wherein the control unit controls the switch to cause the direct current to flow in the first direction so that the upper surface of the Peltier device is heated to melt the thermoplastic resin placed on the resin placement surface and that the resulting molten resin is pressed and spread over an entire surface of one side of the wafer between the resin placement surface and the one side of the wafer, and
        then controls the switch to cause the direct current to flow in the second direction so that the upper surface of the Peltier device is cooled to solidify the resin pressed and spread between the resin placement surface and the one side of the wafer and that a protection member is formed on the entire surface of the one side of the wafer.

* * * * *